United States Patent [19]
Hopwood et al.

[11] Patent Number: 6,077,572
[45] Date of Patent: Jun. 20, 2000

[54] METHOD OF COATING EDGES WITH DIAMOND-LIKE CARBON

[75] Inventors: Jeffrey A. Hopwood, Needham; David L. Pappas, Waltham, both of Mass.

[73] Assignee: Northeastern University, Boston, Mass.

[21] Appl. No.: 08/878,222

[22] Filed: Jun. 18, 1997

[51] Int. Cl.$^7$ .............................. B05D 3/06; C23C 16/26
[52] U.S. Cl. ...................... 427/577; 427/249.7; 427/122; 427/902; 427/904
[58] Field of Search ..................................... 427/577, 249, 427/122, 249.7, 902, 904; 423/446

[56] References Cited

U.S. PATENT DOCUMENTS

| | | | |
|---|---|---|---|
| 3,501,334 | 3/1970 | Fiaherty | 117/49 |
| 3,652,443 | 3/1972 | Fish et al. | 204/298 |
| 3,761,372 | 9/1973 | Sastri | 204/192 |
| 3,761,374 | 9/1973 | Bromer et al. | 204/192 |
| 3,774,703 | 11/1973 | Sanderson | 117/75 |

(List continued on next page.)

FOREIGN PATENT DOCUMENTS

| | | | |
|---|---|---|---|
| 0 411 435 A1 | 2/1991 | European Pat. Off. | C23C 16/26 |
| 0 605 814 A1 | 7/1994 | European Pat. Off. | C23C 16/26 |
| 0351093 | 9/1994 | European Pat. Off. | 21/58 |
| 0 628 379 A1 | 12/1994 | European Pat. Off. | B23P 15/40 |
| 3047 888 A1 | 7/1982 | Germany | B26B 21/60 |
| 8-012492 | 1/1996 | Japan . | |
| 1350594 | 4/1974 | United Kingdom . | |
| WO 92/17323 | 10/1992 | WIPO | 21/60 |

OTHER PUBLICATIONS

Qian, "Diamondlike Carbon Film Deposition Using Ionized Magnetron Sputtering", Thesis, pp. iii–x and 1–67, Jul. 1995.

Pappas et al., "Deposition of Diamondlike Carbon Using a Planar Radio Frequency Induction Plasma", J. Vac. Sci. Technol. A 12(4), Jul./Aug. 1994, pp. 1576–1582.

Wayne Grinthal et al., Surfaces: More Than They Seem, Newsfront, Chemical Engineering, Apr. 1994, p. 35.

Chementator, Chemical Enginnering, Jan. 1994, p. 17.

Leonard LeBlanc, Advanced Technology, Offshore/Oilman, May, 1993, p. 24.

Diamon–Film Coatings Inch Closer to Becoming a Commerical Reality, Electronic Design, Oct. 12, 1989, p. 29.

Gordon Graff, Diamond Power, Polular Science, Sep. 1980, pp. 58–60 & 90.

Technology Newsletter, Chemical Week, Aug. 10, 1988, p. 21.

Gottfried Wehner, Influence of the Angle of Incidence on Sputtering Yields, Journal of Applied Physics, vol. 3 No. 11, Nov. 1959, pp. 1762–1765.

Richard S. Post et al., Pick a Source for Your Next Plasma Deposition Job, Vacuum Technology, Research & Development, Oct. 1989, pp. 106–110.

Kuo et al, Appl. Phys. Lett. 59(20) Nov. 1991, pp. 2532–2534.

*Primary Examiner*—Roy V. King
*Attorney, Agent, or Firm*—Weingarten, Schurgin, Gagnebin & Hayes LLP

[57] ABSTRACT

A method of creating a diamond-like carbon film on a substrate, including the steps of exposing the substrate to a hydrocarbon gas environment and generating plasma in the environment of an electron density greater than approximately $5\times10^{10}$ per $cm^3$ and a sheath thickness less than about 2 mm under conditions of high ion flux and controlled, low energy ion bombardment.

15 Claims, 15 Drawing Sheets

U.S. PATENT DOCUMENTS

| | | | |
|---|---|---|---|
| 3,786,563 | 1/1974 | Dorion, Jr. et al. | 30/50 |
| 3,829,969 | 8/1974 | Fischbein et al. | 30/346.54 |
| 3,900,636 | 8/1975 | Curry et al. | 427/38 |
| 3,904,020 | 9/1975 | Lane | 204/192 |
| 3,911,579 | 10/1975 | Lane et al. | 30/346.56 |
| 3,915,757 | 10/1975 | Engel | 148/6 |
| 3,960,608 | 6/1976 | Cole | 30/346.54 |
| 3,961,103 | 6/1976 | Aisenberg | 427/39 |
| 4,122,602 | 10/1978 | Sastri et al. | 30/346.5 |
| 4,389,773 | 6/1983 | Nissen et al. | 30/50 |
| 4,416,912 | 11/1983 | Bache | 427/13 |
| 4,434,188 | 2/1984 | Kamo et al. | 427/39 |
| 4,452,686 | 6/1984 | Axenov et al. | 204/298 |
| 4,490,229 | 12/1984 | Mirtich et al. | 204/192 |
| 4,504,519 | 3/1985 | Zelez | 427/39 |
| 4,620,913 | 11/1986 | Bergman | 204/192 R |
| 4,645,895 | 2/1987 | Boxman et al. | 219/76.13 |
| 4,673,477 | 6/1987 | Ramalingam et al. | 204/192.38 |
| 4,720,918 | 1/1988 | Curry et al. | 30/346.55 |
| 4,816,291 | 3/1989 | Desphandey et al. | 427/38 |
| 4,822,466 | 4/1989 | Rabalais et al. | 204/192.15 |
| 4,842,945 | 6/1989 | Ito et al. | 428/457 |
| 4,849,290 | 7/1989 | Fujimori et al. | 428/408 |
| 4,919,968 | 4/1990 | Buhl et al. | 427/37 |
| 4,929,321 | 5/1990 | Buhl | 204/192.38 |
| 4,933,058 | 6/1990 | Bache et al. | 204/192.3 |
| 4,958,590 | 9/1990 | Goforth | 118/723 |
| 5,009,923 | 4/1991 | Ogata et al. | 427/38 |
| 5,010,646 | 4/1991 | Neamtu | 30/50 |
| 5,022,801 | 6/1991 | Anthony et al. | 408/144 |
| 5,032,243 | 7/1991 | Bache et al. | 204/192.34 |
| 5,048,191 | 9/1991 | Hahn | 30/346.54 |
| 5,064,682 | 11/1991 | Klyama et al. | 427/38 |
| 5,087,478 | 2/1992 | Williamson | 127/39 |
| 5,088,202 | 2/1992 | Boland et al. | 30/346.54 |
| 5,097,637 | 3/1992 | Shepherd | 51/295 |
| 5,142,785 | 9/1992 | Grewal et al. | 30/32 |
| 5,232,568 | 8/1993 | Parent et al. | 204/192.3 |
| 5,256,930 | 10/1993 | Hughes | 313/30 |
| 5,279,723 | 1/1994 | Falabella et al. | 204/192.38 |
| 5,295,305 | 3/1994 | Hann et al. | 30/50 |
| 5,308,661 | 5/1994 | Feng et al. | 427/535 |
| 5,318,809 | 6/1994 | Sussman | 427/561 |
| 5,346,600 | 9/1994 | Nieh et al. | 204/192.3 |
| 5,378,285 | 1/1995 | Mitani et al. | 118/723 MC |
| 5,391,229 | 2/1995 | Kosky et al. | 118/500 |
| 5,421,891 | 6/1995 | Campbell et al. | 118/723 R |
| 5,426,851 | 6/1995 | Gilder et al. | 30/50 |
| 5,429,070 | 7/1995 | Campbell et al. | 118/723 R |
| 5,449,412 | 9/1995 | Pinneo | 118/723 MP |
| 5,458,827 | 10/1995 | Holly | 264/400 |
| 5,474,816 | 12/1995 | Falabolla | 427/580 |
| 5,488,774 | 2/1996 | Janowski | 30/346.53 |
| 5,497,550 | 3/1996 | Trotta et al. | 30/50 |
| 5,510,098 | 4/1996 | Chow | 423/445 B |
| 5,645,900 | 7/1997 | Ong et al. | 427/571 |
| 5,720,808 | 2/1998 | Hirabayashi et al. | 117/103 |

FIG. 11
FIG. 13
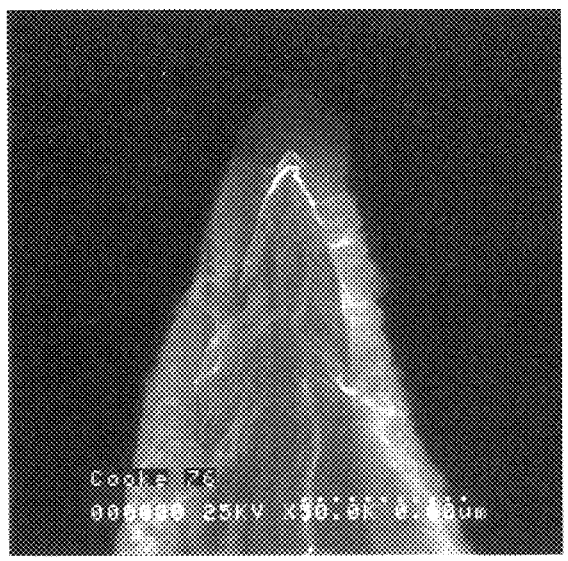
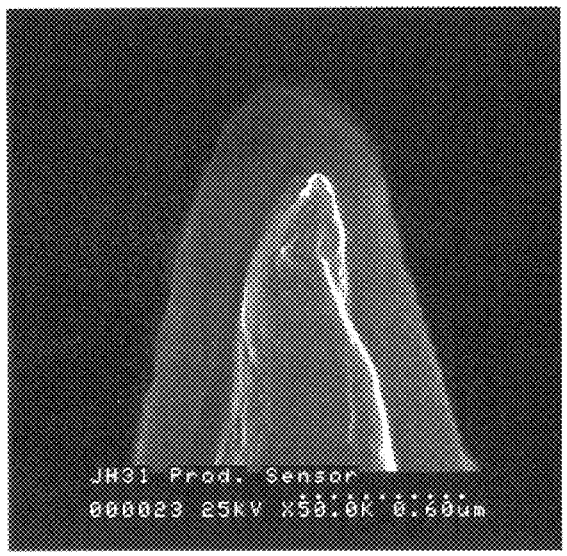

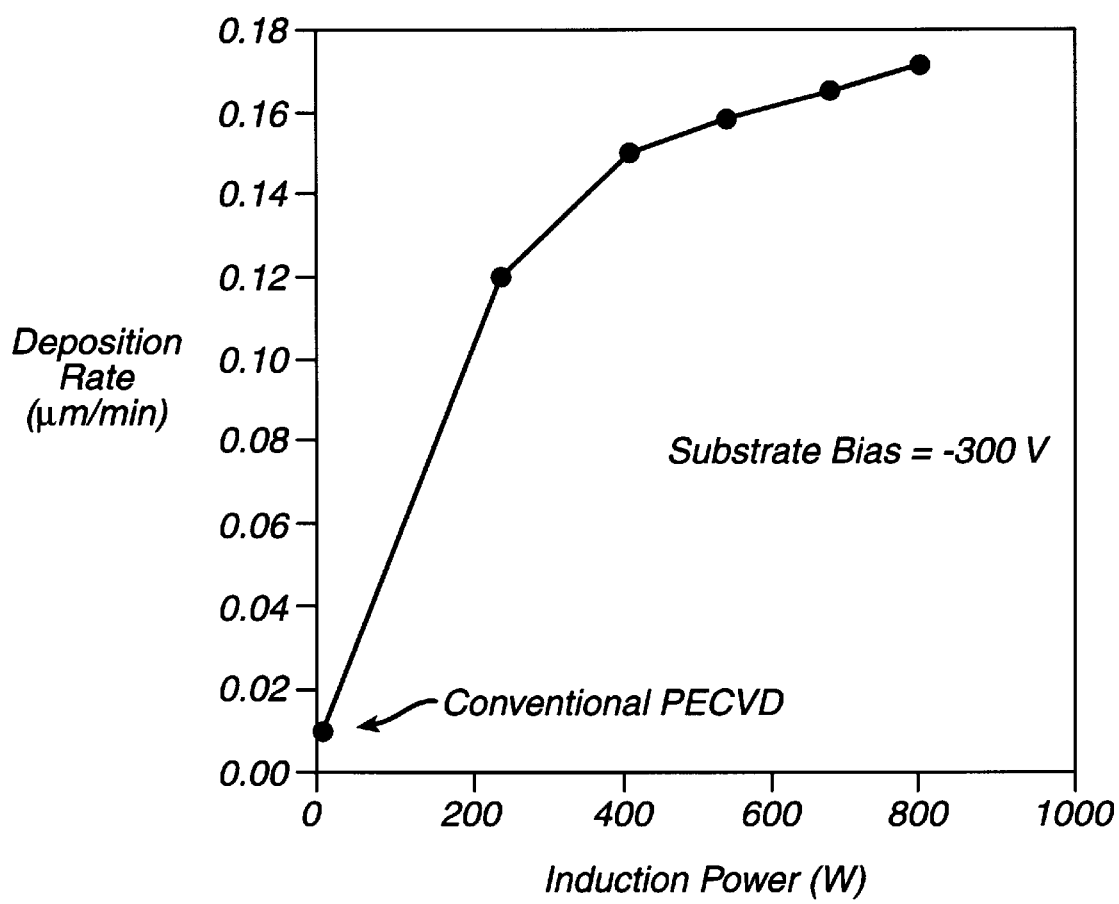

METHOD OF COATING EDGES WITH DIAMOND-LIKE CARBON

FIELD OF THE INVENTION

This invention relates to the field of chemical vapor deposition and more particularly to plasma enhanced chemical vapor deposition of high quality, diamond-like carbon films on partially-enclosed or highly-angled surfaces.

BACKGROUND OF THE INVENTION

Hard, thin films of hydrogenated, amorphous carbon (a-C:H), also called diamond-like carbon (DLC) films, can be created on metal surfaces by plasma-enhanced chemical vapor deposition (PECVD). Known PECVD processes which are used to create such films produce ions at low density ($\sim 10^{10}$ cm$^{-3}$). The known processes generate plasmas with sheath thicknesses that are wide (0.5–1.0 cm) and do not conform to small surface variations in the substrate ($\sim 0.1$ mm). Therefore, ions which are accelerated across the sheath in the known processes do so perpendicularly to the macroscopic surface of the substrate. Under these conditions, angled substrate surfaces, such as razor blade edges (which typically have a spacing of 100 μm between the tips of blades in a stack), are subject to oblique fluxes of reactive ions. These conditions are believed to cause self-shadowing of some of the depositing species, leading to columnar growth of a-C:H films. It is also believed that the low plasma density yields a relatively low ion-to-atom ratio at the substrate surface. Deposition under conditions in which adatom surface mobility is poor, for example at low substrate temperatures ($T/T^{melt} < 0.1$) and low ion flux, is also believed to exaggerate columnar growth of a-C:H films on highly-angled substrates. Such columnar growth results in films which contain voids and grain boundaries, and exhibit poor mechanical strength. Columnar growth is observed in PECVD of a-C:H films in low-density RF capacitively coupled plasma reactors on highly-angled substrates such as razor blades.

The known approaches also suffer from low deposition rates. The low electron density of the known approaches does not effectively dissociate the hydrocarbon feed gas. Therefore, the number of precursor molecular fragments in the low density plasma is low. For example, typical deposition rates for capacitively coupled plasma PECVD of a-C:H are in the order of 20 nm/minute. These low deposition rates hinder processing throughput and result in low profitability for the process.

BRIEF SUMMARY OF THE INVENTION

The present invention is an improvement in the chemical vapor deposition of a-C:H films onto substrate surfaces, such as metallic substrate surfaces. Broadly, the invention includes the chemical vapor deposition of a-C:H films under conditions which provide conformal sheaths, high ion flux and controlled, low energy ion bombardment. The invention includes exposing a substrate to a hydrocarbon gas environment and generating plasma in the environment of an electron density greater than approximately $5 \times 10^{10}$ per cm$^3$ and a sheath thickness less than about 2 mm under conditions of high ion flux and controlled, low energy ion bombardment.

Conditions of the invention which provide conformal sheaths, high ion flux and controlled, low energy ion bombardment include an ion current density ($J_i$) greater than approximately 2 mA/cm$^2$ and a bias voltage ($-V_{bias}$) within a range of approximately 100 to approximately 1000 volts. Such conditions allow the formation of hard, dense diamond-like carbon (a-C:H) films onto needle points, razor blade edges, cutting bits and edges, and other pointed, angled or sharp surfaces, or other partially-enclosed or high angle surfaces such a those found on certain writing instruments (pen nibs, pen ball seats, etc.), without the columnar growth of the films associated with the other known processes.

In particular, in one aspect of the invention, an inductively coupled plasma chemical vapor deposition reactor in which the plasma power is controlled independently from the substrate bias, is used to dissociate a hydrocarbon feed gas such as $C_4H_{10}$. The substrate or workpieces, such as razor blades stacked side-by-side, are positioned inside the vacuum plasma chamber of the reactor on a chuck.

The chuck is coupled to a radio frequency (RF) power source (e.g., 13.56 MHz) through an impedance matching network. Plasma is generated under conditions of maximized ion flux (i.e., high RF power to the inductively coupled plasma) and moderate substrate bias (e.g., $J_i > \sim 3$ mA/cm$^2$ and $\sim 200V < -V_{bias} < \sim 500V$ in the preferred embodiment). The power supply to the chuck adjusts the energy of ions extracted from the plasma to the substrate, and the plasma discharge is created independently from the substrate bias. Thus, a high ion flux is obtained simultaneously with moderate-to-low ion bombardment energy. Other processes which are capable of producing a high density plasma can also be used. These include microwave, electron cyclotron resonance, and other advanced RF plasma generation processes, such as helicon wave sources and helical resonators.

In accordance with another aspect of the invention, an interlayer can be used between the substrate and the diamond-like carbon film. This interlayer can be selected from the group consisting of silicon, silicon carbide, vanadium, tantalum, nickel, niobium, molybdenum, and alloys of such materials. Experience has demonstrated that silicon works particularly well as a material for such an interlayer.

The high efficiency of the inductively coupled plasma can produce an ion flux which can be approximately ten times greater than in a conventional RF capacitively coupled plasma. These conditions produce advantages of reduced sheath width, increased ion-to-atom ratio, and a very high deposition rate. The reduced sheath width allows conformal coverage of smaller structures and variations in the substrate surface. The conformal sheath causes the ions to strike the surface perpendicularly or at low angles, leading to dense film. The increased ion-to-atom ratio results in enhanced surface mobility for adatoms and deposition of higher density films. The higher deposition rates, which occur because the plasma is more fully dissociated, result in faster throughput and cost savings.

Because of these advantages, diamond-like carbon films can be generated which have a dense film structure (i.e., significantly reduced or no columnar grains or voids which decrease the mechanical strength [e.g., no discernable grains 300 Å or greater in diameter when viewed at a magnification of 50,000× in a field-emission scanning electron microscope]) and high hardness (film hardness of greater than approximately 20 GPa) at a high deposition rate, resulting in reduced cost per part. The process can have additional advantages which can include self sharpening (sputter sharpening) of cutting edges due to the intense ion flux bombardment, high rate of chamber clean up using an

3 oxygen plasma, and rapid throughput during any plasma precleaning step which may be employed prior to deposition.

BRIEF DESCRIPTION OF THE SEVERAL VIEWS OF THE DRAWINGS

The present invention will be more fully understood from the following detailed description considered in conjunction with the accompanying drawings, in which:

FIG. 11 is a photomicrograph (taken at 50,000×) of a cross-section of a diamond-like film deposited on a razor blade edge by conventional capacitively coupled plasma chemical vapor deposition;

FIG. 13 is a photomicrograph (taken at 50,000×) of a cross-section of a diamond-like film deposited on a razor blade edge in accordance with the present invention;

FIG. 14 is a graph which illustrates the deposition rate of the present invention as a function of RF induction power;

DETAILED DESCRIPTION OF THE INVENTION

The present invention provides an improvement in the formation of diamond-like carbon films on substrates by plasma enhanced chemical vapor deposition. In accordance with the present invention, dissociation of a hydrocarbon gas by plasma enhanced chemical vapor deposition under conditions of high ion flux and controlled, low energy ion bombardment will form a hard, dense a-C:H film on a substrate without the kind of columnar growth associated with other known processes, even if the substrate is oddly shaped or includes oblique angles. The invention includes exposing a substrate to a hydrocarbon gas environment and generating plasma in the environment of an electron density greater than approximately $5 \times 10^{10}$ per $cm^3$ and a sheath thickness less than about 2 mm under the conditions of high ion flux and controlled, low energy ion bombardment. Such conditions can be attained through independent control of the density of the ion flux and the substrate bias to maximize the ion flux while maintaining moderate substrate bias. These conditions include an ion current ($J_i$) greater than approximately 2 mA/cm$^2$ and a bias voltage ($-V_{bias}$) within a range of approximately 100 to approximately 1000 volts.

In one embodiment of the present invention, an inductively coupled plasma chemical vapor deposition reactor is used to produce on an angled substrate the dense, hard a-C:H film of the present invention. While the present invention is illustrated in terms of inductively coupled plasma chemical vapor deposition, other plasma generating processes which are capable of producing high density plasma can also be used.

Figure 1:
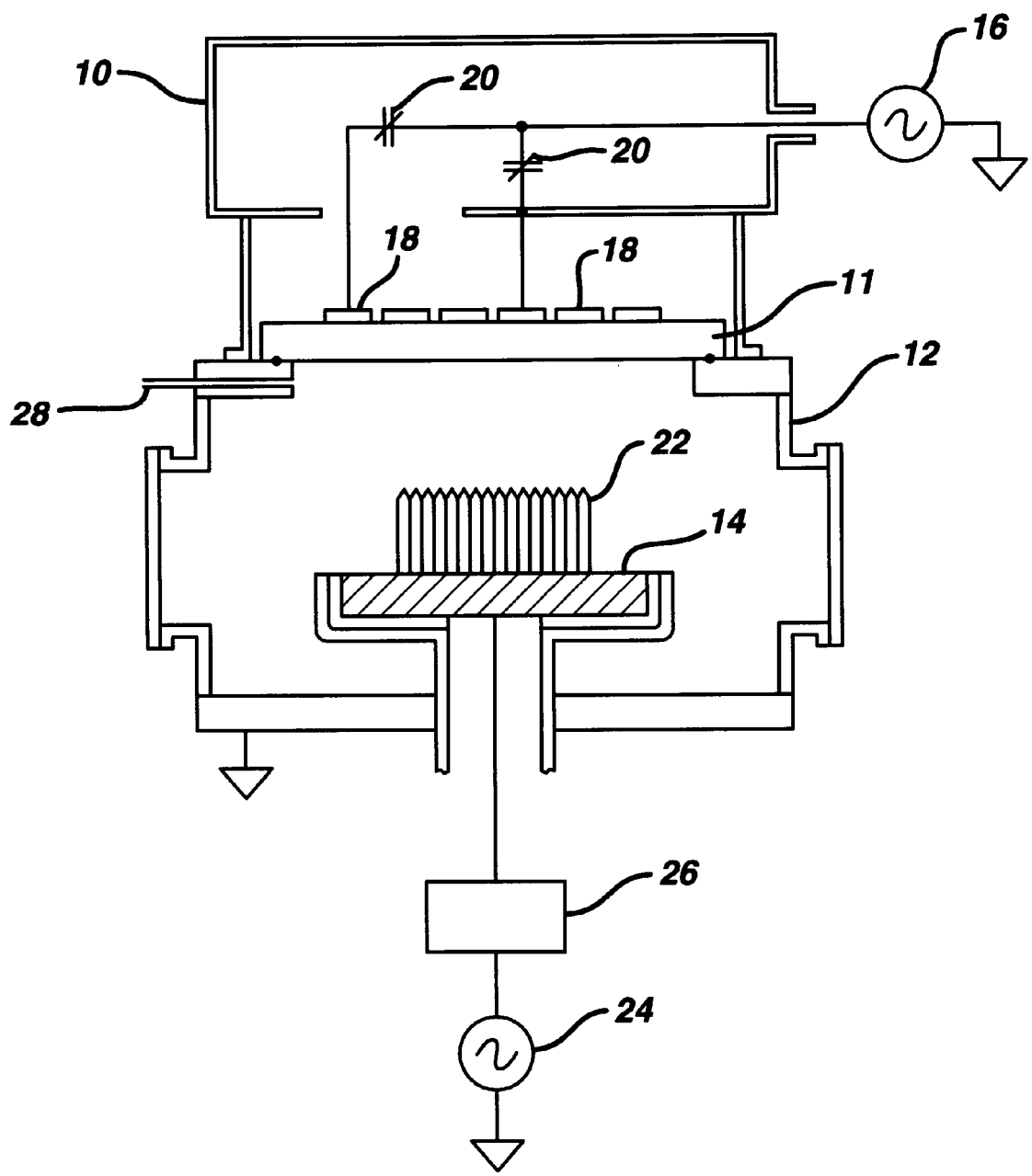
FIG. 1 is a cross-sectional diagram of an inductively coupled plasma chemical vapor deposition reactor useful in practicing the present invention.

The inductively coupled reactor which can be used in the practice of the present invention is shown in FIG. 1. The reactor of FIG. 1 includes an induction plasma generator 10 coupled to a vacuum plasma chamber 12, in which a substrate chuck 14 is located in the plasma field below a quartz window 11. Typically, chuck 14 would be water-cooled. Although water cooling is preferred, some heating is acceptable. Thus, a large thermal sink could also be used.

The plasma generator 10 includes a radio frequency (RF) source 16 connected to induction coils 18 through capacitors 20. Within the plasma chamber 12, the substrate or workpieces 22 (depicted as razor blades stacked side by side), are positioned on chuck 14. Chuck 14 is coupled to a radio frequency (RF) power supply 24 (typically 13.56 MHz) through an impedance matching network 26. The RF power supple 24 of the chuck 14 allows adjustment of the energy of the ions extracted from the plasma to the workpieces 22. A hydrocarbon feed gas to be dissociated by the plasma is provided to the plasma chamber 12 through gas inlet 28. Typically, the feed gas will be $C_4H_{10}$, but other hydrocarbon gasses, such as $CH_4$, $C_2H_2$, $C_6H_6$, $C_2H_6$ and/or $C_3H_8$, can also be used. Preferably, the workpieces 22 are positioned 5 to 15 cm downstream (below the quartz window 11) and kept at room temperature by the water-cooled chuck 14.

Using the apparatus described above, runs were made at various levels of induction plasma power and substrate bias voltage. Two examples of deposition on blade edges which illustrate the present invention are summarized below:

EXAMPLE I

| Induction of plasma power: | 400 W at 13.56 MHz, producing 3 mA/cm² of ion current |
|---|---|
| Substrate bias voltage: | −300 V (dc) |
| Gas type: | Butane, $C_4H_{10}$ |
| Gas flow: | 50 standard cubic centimeters per minute (sccm) |
| Pressure: | 5 mTorr (plasma off), 12 mTorr (plasma on) |
| Computed sheath width: | 1240 μm |
| Deposition rate on blade edges: | 100 nm/min. |
| Comments: | Slight columnar growth Density rating = 3.5 |

EXAMPLE II

| Induction plasma power: | 800 W at 13.56 MHz, producing 6 mA/cm² of ion current |
|---|---|
| Substrate bias voltage: | −200 V (dc) |
| Gas type: | Butane, $C_4H_{10}$ |
| Gas flow: | 50 standard cubic centimeters per minute (sccm) |
| pressure: | 5 mTorr (plasma off), 12 mTorr (plasma on) |
| Computed sheath width: | 650 μm |
| Deposition rate on blade edges: | 100 nm/min. |
| Comments: | No columnar growth Density rating = 4.0 |

In the examples, reference is made to a "density rating" for the films. This rating corresponds to a semi-quantitative system for categorizing blade edge coatings in which the microstructure of the coating is evaluated using field emission scanning electron microscopy at a magnification of 50,000×. Based upon the appearance of grains and void structure, a rating is assigned in accordance with the following table:

| Coating Microstructure | Density Rating |
|---|---|
| Highly columnar, obvious grain structure, highly porous | 1.0 |
| Columnarity plainly evident, somewhat smaller grains | 2.0 |
| Some columnarity and grain structure visible | 3.0 |
| Fully dense | 4.0 |

Figure 2:
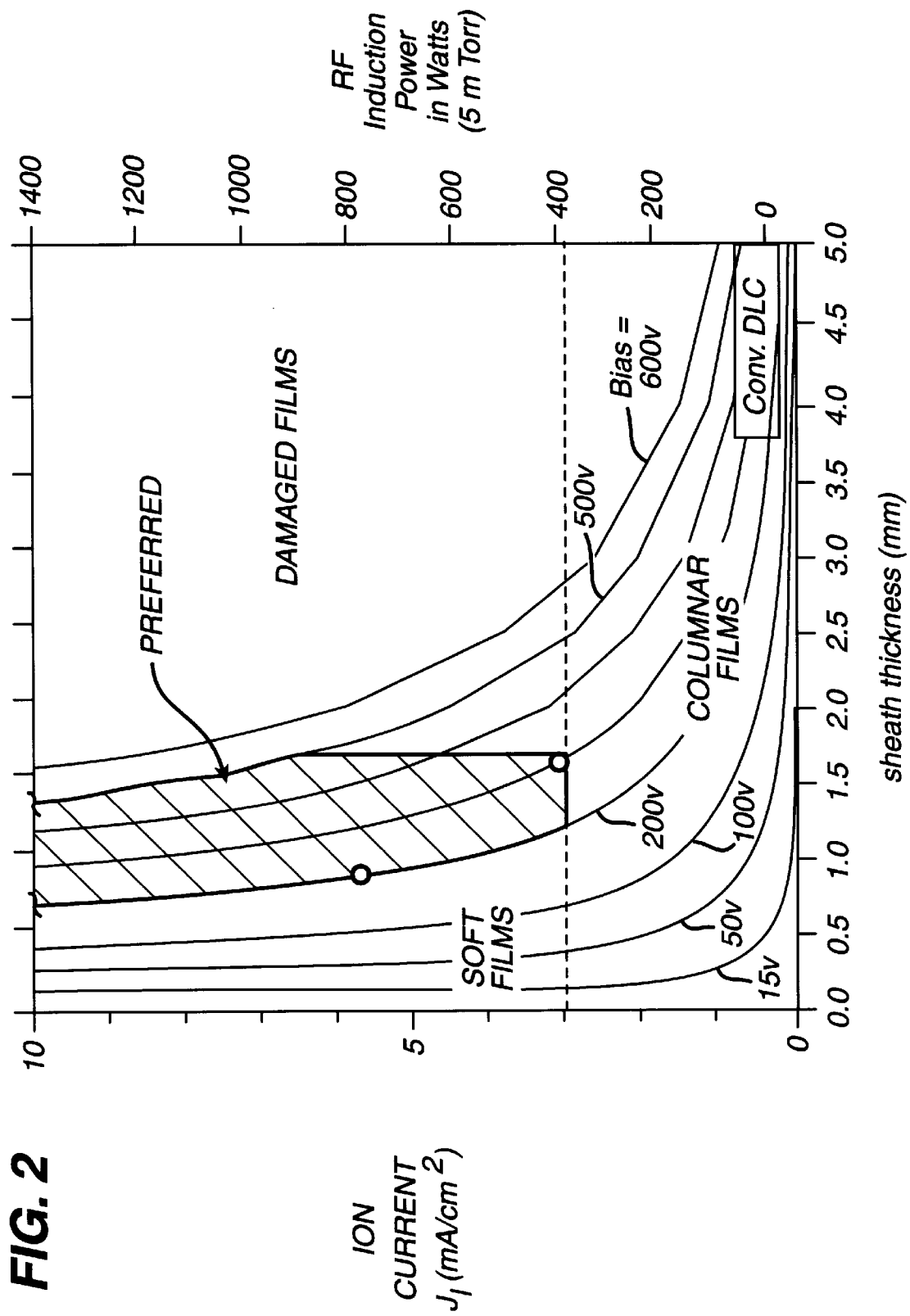
FIG. 2 is a graph which illustrates the present invention in terms of ion current/RF induction power, average substrate bias voltage and sheath thickness.
Figure 3:
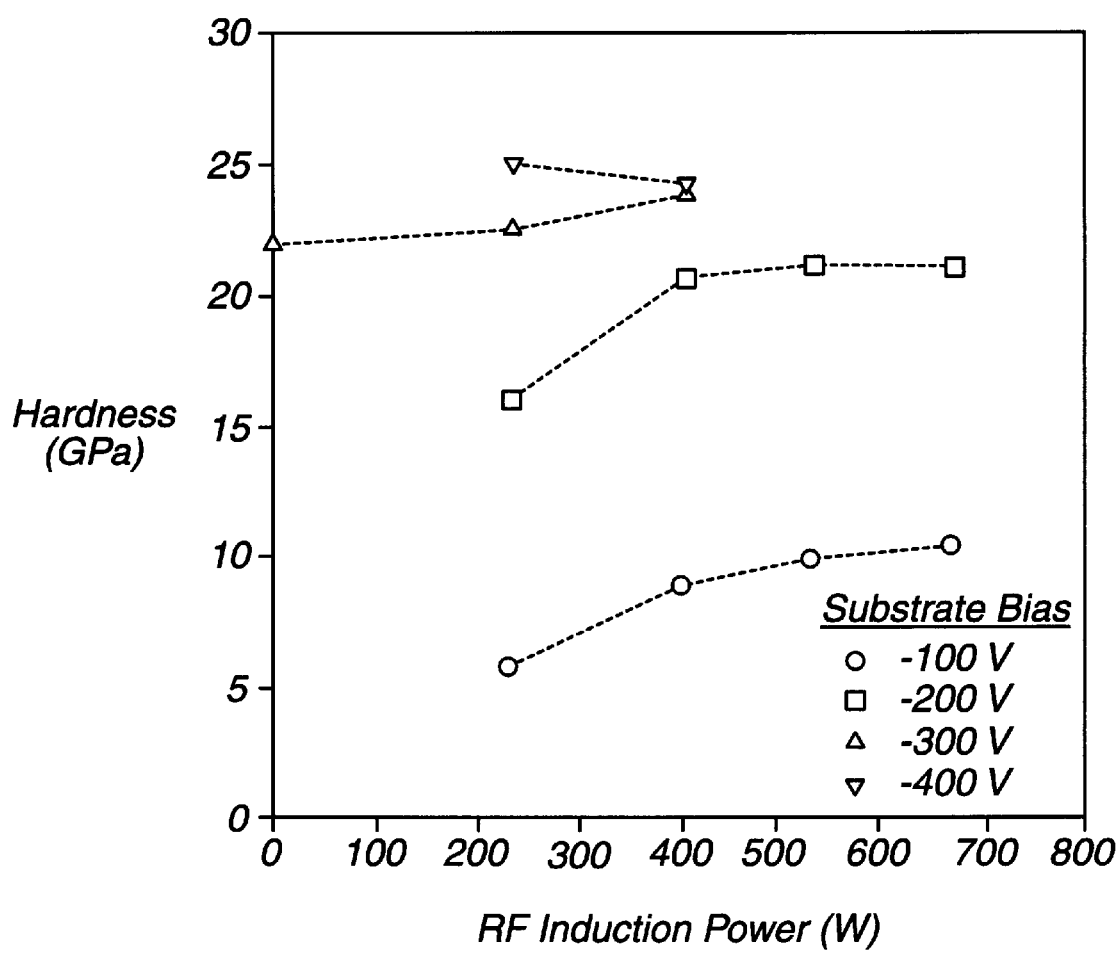
FIG. 3 is a graph which illustrates the hardness of films generated in accordance with the present invention as a function of RF induction power and average substrate bias voltage.
Figure 4:
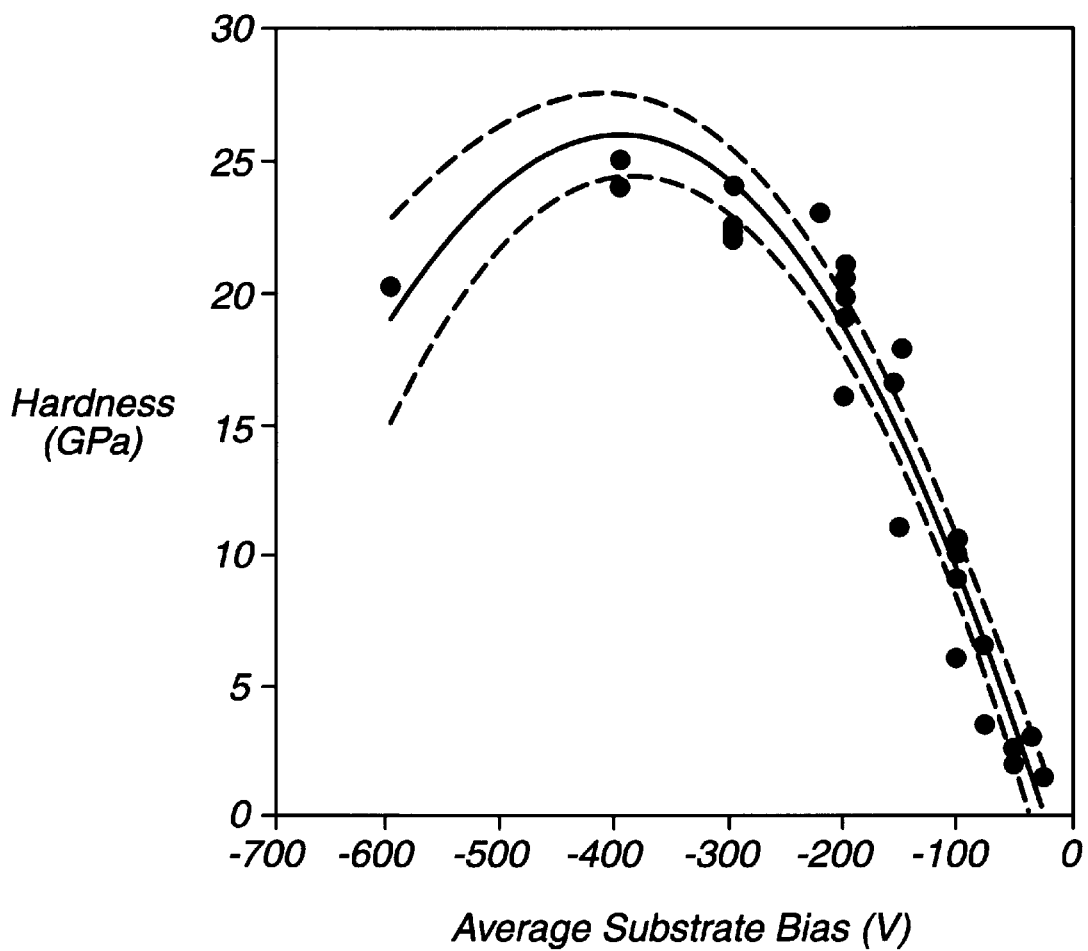
FIG. 4 is a graph which illustrates the hardness of films produced in accordance with the present invention as a function of average substrate bias.
Figure 5:
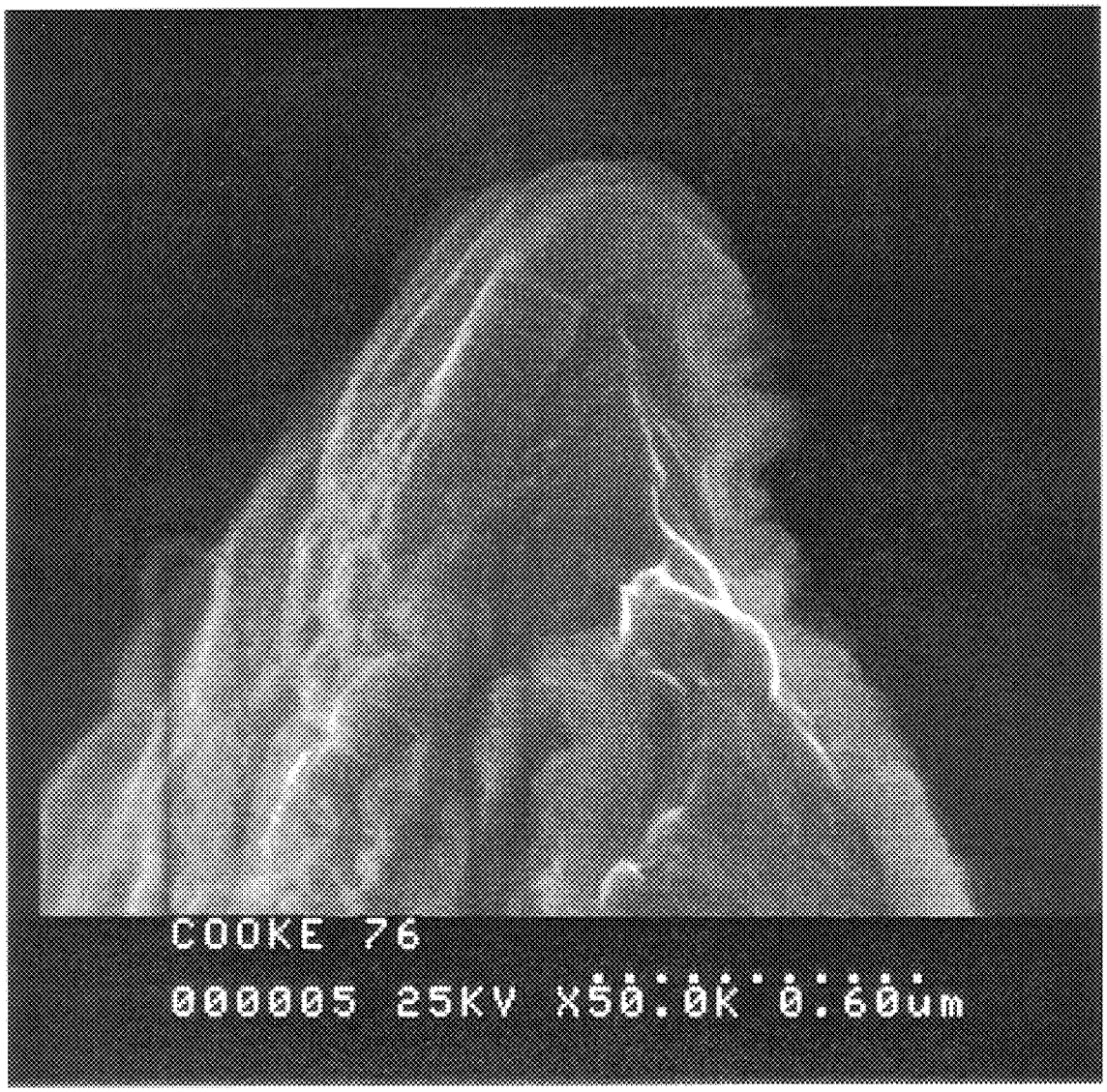
FIG. 5 is a photomicrograph (taken at 50,000×) of a cross-section of a diamond-like film deposited on a razor blade by conventional capacitively coupled plasma-enhanced chemical vapor deposition.
Figure 6:
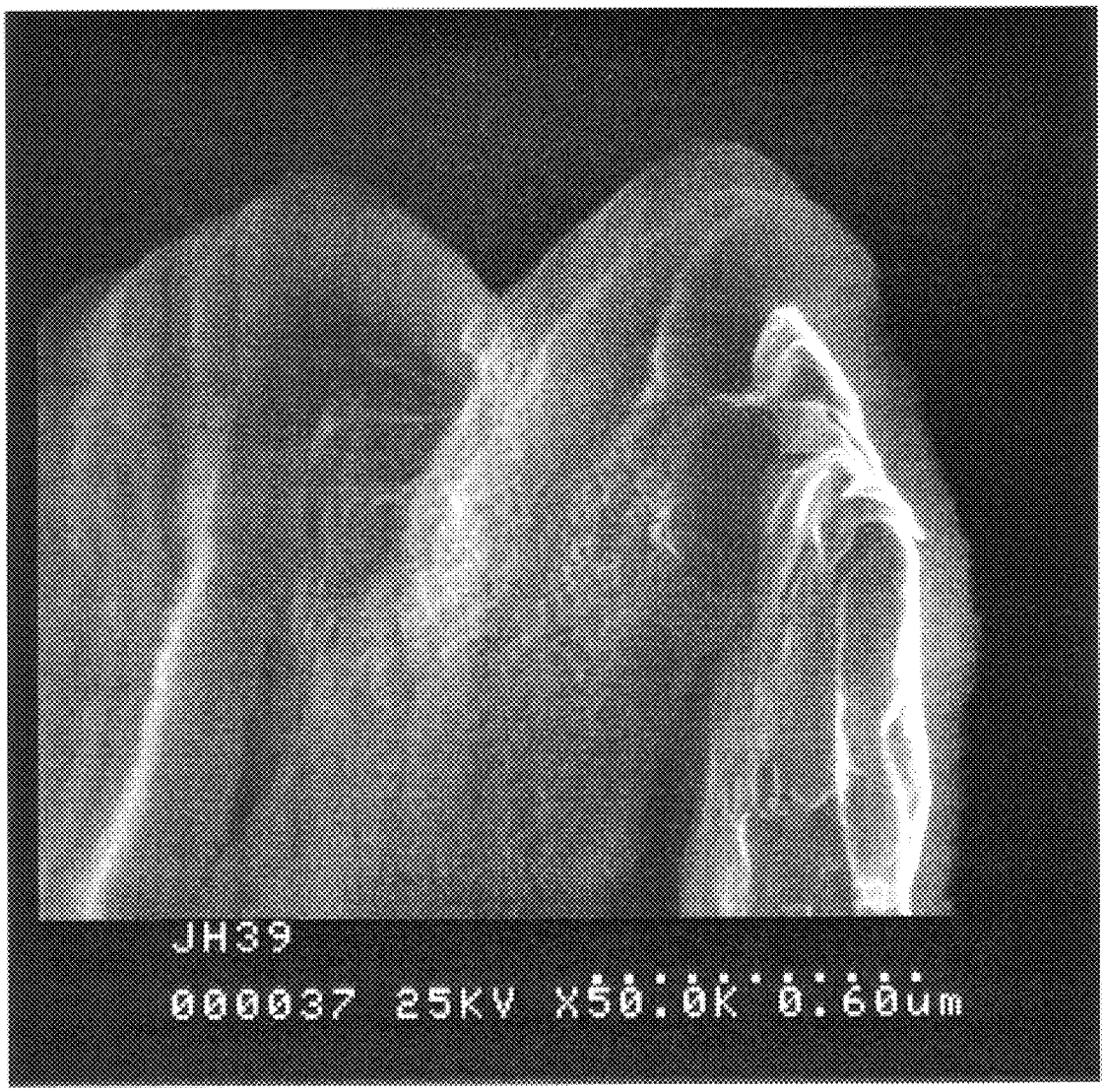
FIG. 6 is a photomicrograph (taken at 50,000×) of a cross-section of a diamond-like film deposited on a razor blade in a demonstration run of the present invention.
Figure 7:
FIG. 7 is a photomicrograph (taken at 50,000×) of a cross-section of a diamond-like film deposited on a razor blade in a further demonstration run of the present invention.
Figure 8:
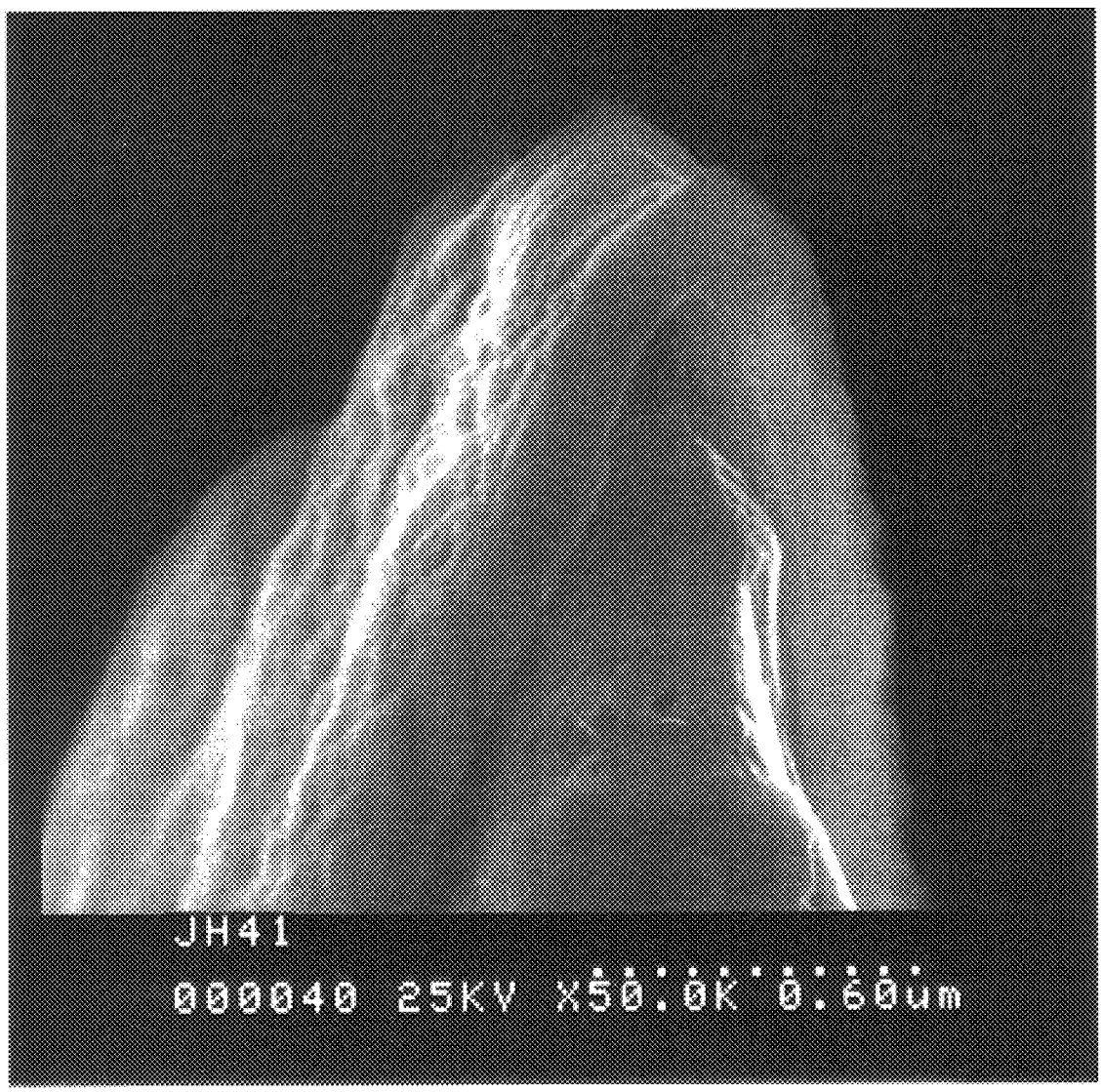
FIG. 8 is a photomicrograph (taken at 50,000×) of a cross-section of a diamond-like film deposited on a razor blade in a further demonstration run of the present invention.
Figure 9:
FIG. 9 is a photomicrograph (taken at 50,000×) of a cross-section of a diamond-like film deposited on a razor blade in a further demonstration run of the present invention.

The results of the above examples and other runs are shown in the graphs of FIGS. 2 through 4. FIG. 2 graphically illustrates pertinent aspects of the present invention in terms of ion current/RF induction power, average substrate bias voltage and sheath thickness. The figure also shows the region of the preferred embodiment of the present invention. As can be seen in the figure, the magnitude of ion current affects the columnar growth of the films. Lower values of ion current result in increased growth of columnar films. Higher values of ion current result in less columnar microstructure. Although not completely evident from the figure, wide plasma sheaths may also result in increased columnar microstructures.

In FIG. 2, it can also be seen that the average substrate bias affects the hardness of the films. At lower average substrate bias values, the films are relatively soft. As the average bias values increase, the hardness of the films increases. However, excessively high substrate bias results in damaged films and a decrease in film hardness because of graphitization.

FIG. 2 also demonstrates that the sheath thickness varies as a function of ion current density and substrate bias. As can be seen in FIG. 2, plasma sheath thickness increases as the substrate bias increases. Thus, as the substrate bias increases, the conformality of the plasma to the substrate decreases.

The conditions in which advantages of the present invention occur include an ion current ($J_i$) greater than approximately 2 mA/cm² and an average substrate bias ($-V_{bias}$) within a range of approximately −100 to approximately −1000 volts. The conditions which produce the presently preferred embodiment (and which are shown in the large, upper highlighted portion of FIG. 2 labelled "PREFERRED") include an ion current ($J_i$) greater than or equal to approximately 3 mA/cm², an average substrate bias ($V_{bias}$) within a range of approximately −200 to approximately −500 volts, and sheath thickness less than or equal to approximately 1.7 mm (for blades edges in a stacked configuration).

For comparison, the lower right, highlighted region of FIG. 2 (labelled "Conventional DLC") outlines conditions and characteristics associated with capacitively coupled, low density chemical vapor deposition. An example of such conventional process conditions (RF power to substrate electrode) are as follows:

| Induction plasma power: | 0 W |
|---|---|
| Substrate bias voltage: | −300 V (d.c) producing 0.34 mA/cm² |
| Gas type | Butane, $C_4H_{10}$ |
| Gas flow: | 50 standard cubic centimeters per minute (sccm) |
| Pressure: | 5 mTorr (plasma off), 7 mTorr (plasma on) |
| Computed sheath width: | 3630 μm |
| Deposition rate: | 10 nm/min. |

In capacitively coupled chemical vapor deposition, the ion current is low (approximately 0.3 mA/cm²) and the sheath is wide. Columnar films are observable on the blade edges.

FIG. 3 demonstrates that the nanohardness of the generated films varies as a function of both RF induction power and average substrate bias voltage (i.e, the average energy of ions at the work piece). As can be seen in FIG. 3, increased substrate bias and RF induction power increases film hardness. Again, excessively high substrate bias causes a decrease in film hardness because of graphitization.

FIG. 4, which shows the hardness of the film produced as a function of average substrate bias at 200–800 W of RF induction power, demonstrates that moderate average substrate bias (e.g., approximately −200 to approximately −500 V) produces the films with the highest hardness. FIG. 4 also further demonstrates that excessively high substrate bias will decrease the film hardness. The solid line in FIG. 4 represents a best fit to the data. The dashed lines correspond to the 95% confidence limits of the fit.

The following additional examples of PECVD on blade edges demonstrate the effect of changes in induction power/ion current on sheath width and columnar growth. All conditions were fixed, except the induction power/ion current:

| Run | Induction Power (W) | Bias (V) | Ion Flux (mA/cm$^2$) | Sheath Width (mm) (Calc.) |
|---|---|---|---|---|
| 1 | 0 | −200 | <1 | — |
| 2 | 120 | −200 | 1.45 | 2 |
| 3 | 250 | −200 | 2.65 | 1.5 |
| 4 | 500 | −200 | 4.58 | 1 |
| 5 | 800 | −200 | 5.66 | 0.8 |

The results of these runs are shown in the photomicrographs of FIGS. 5–9 respectively, which were each taken at a magnification of 50,000× in a field-emission scanning electron microscope (SEM). Columnar microstructure is readily apparent in the coatings of FIGS. 5 and 6, which correspond to Runs 1 and 2, respectively. The film shown in FIG. 7, which corresponds to Run 3, appears to be borderline, but columnarity is still evident. No columnar structure (such as well-defined grains 300 Å or greater in diameter in both the surface and cross-sectional images when viewed at 50,000× in the field-emission scanning electron microscope (SEM)) is discernible in the films of FIGS. 8 and 9, which correspond to Runs 4 and 5, respectively. Thus, as shown in FIG. 2, a lower ion current limit of approximately 3 mA/cm$^2$, corresponding to an induction power of approximately 400 W, has been chosen for the preferred embodiment.

Figure 10:
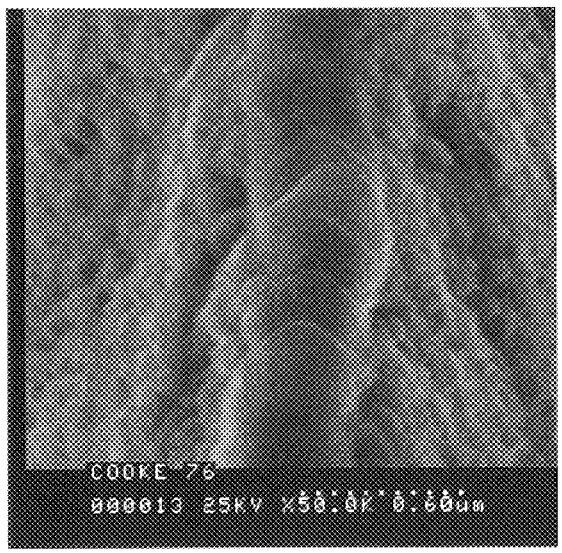
FIG. 10 is a photomicrograph (taken at 50,000×) of an elevated perspective view of a diamond-like film deposited on a razor blade edge by conventional capacitively coupled plasma chemical vapor deposition.

The photomicrographs of FIGS. 10 through 13 further pictorially demonstrate the superior quality of a-C:H films deposited in accordance with the present invention. These photomicrographs were also taken at a magnification of 50,000× in a field-emission scanning electron microscope (SEM). FIGS. 10 and 11 each show a-C:H film deposited on a razor blade edge by conventional capacitively coupled plasma chemical vapor deposition techniques. FIGS. 10 and 11 show well-defined grains and columnar growth of the a-C:H film on the blade edge.

Figure 12:
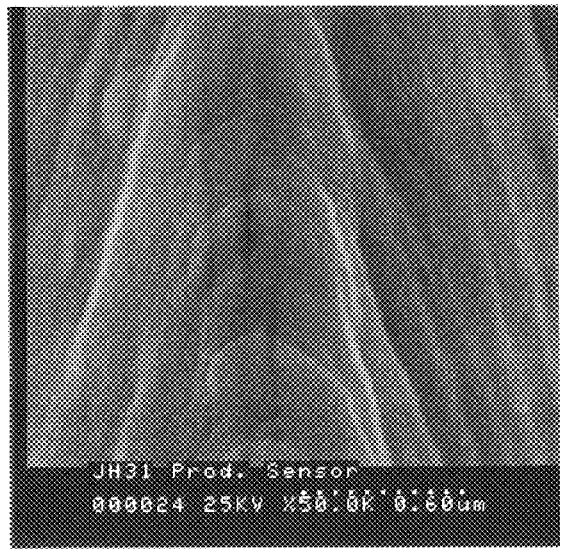
FIG. 12 is a photomicrograph (taken at 50,000×) of an elevated perspective view of a diamond-like film deposited on a razor blade in accordance with the present invention.

In contrast, FIGS. 12 and 13 each show an a-C:H film deposited on the edge of a razor blade in accordance with the present invention. FIGS. 12 and 13 clearly show good deposition of the film onto the blade edge without observable columnar growth or observable grains when viewed at 50,000× in the field-emission scanning electron microscope (SEM). No columnar microstructure or voids can be seen in the film deposited in accordance with the present invention.

Further illustrating the present invention, and demonstrating the increases in deposition rates associated with the present invention, FIG. 14 is a graph depicting the deposition rate as a function of RF induction power. As the inductively coupled plasma is gradually turned on, the deposition rate increases considerably. At the origin of the plot, only RF bias is applied to the substrate, resulting in a deposition rate of 10 nm/minute and a self-bias of −300 V. This corresponds to capacitively coupled plasma vapor deposition. As induction power is increased, the bias power is adjusted to maintain −300 V. At 800 W of induction power, the deposition rate is approximately 170 nm/minute, which is about 17 times higher than conventional capacitively coupled plasma vapor deposition.

Figure 15A:
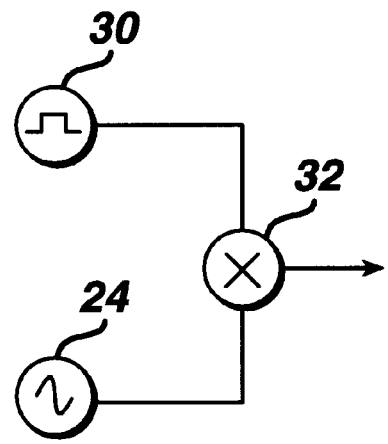
FIG. 15A is a schematic diagram illustrating a further embodiment of the present invention.
Figure 15B:
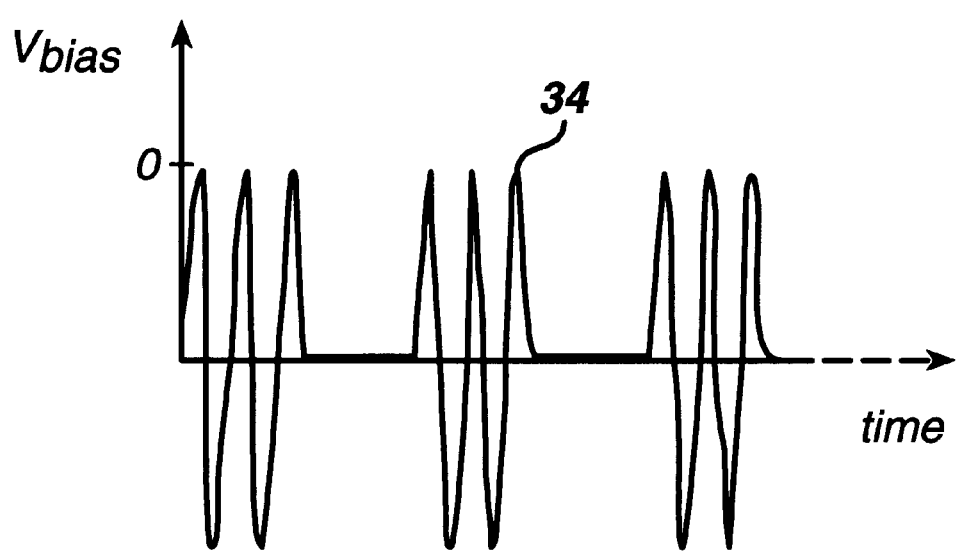
FIG. 15B is a graph illustrating an example of the pulsed RF bias of the embodiment of FIG. 15A.

In the examples of the invention described above, 13.56 MHz RF power was continuously applied to the substrate or workpieces to provide the substrate bias. In a further aspect of the invention, the bias power applied to the substrate or workpieces can be pulsed. Referring to FIGS. 15A and 15B, the sine wave of the RF power supple 24 is modulated by a square wave from square wave generator 30 by modulator 32 to produce a pulsed RF bias voltage 34.

In the embodiment of FIGS. 15A and 15B, the duty-cycle is the bias on-time as a fraction of the total square-wave period. Varying the duty-cycle can have two advantages: 1) the average bias voltage (ion energy) can be decreased but the peak voltage can be maintained in the optimal range, and 2) the sheath can relax to the zero-bias thickness (for example, approximately 30 μm) during the "off" period, which can provide good conformal coverage of the workpiece during this period.

Figure 16:
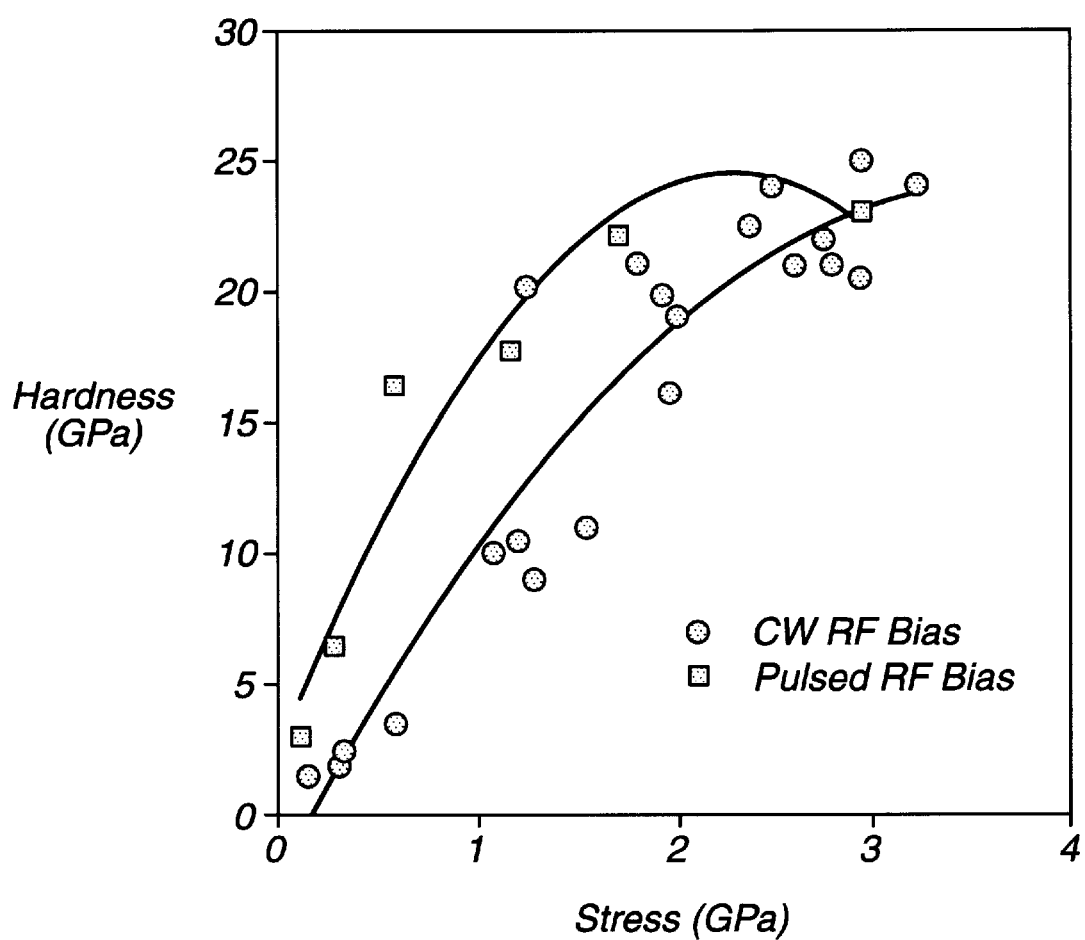
FIG. 16 is a graph illustrating hardness verses internal film stress on pulsed bias films of the present invention as compared to continuous wave biased films.

FIG. 16 shows the effect of internal film stress on pulsed bias films as compared to continuous wave (CW) biased films. The pulsing technique allows reduction of film stress independently from hardness, a further unique feature of the present invention.

In accordance with a further aspect of the invention, an interlayer can be used between the substrate and the diamond-like carbon film. This interlayer can be selected from the group consisting of silicon, silicon carbide, vanadium, tantalum, nickel, niobium, molybdenum, and alloys of such materials. Experience has demonstrated that silicon works particularly well as a material for such an interlayer.

Figure 17:
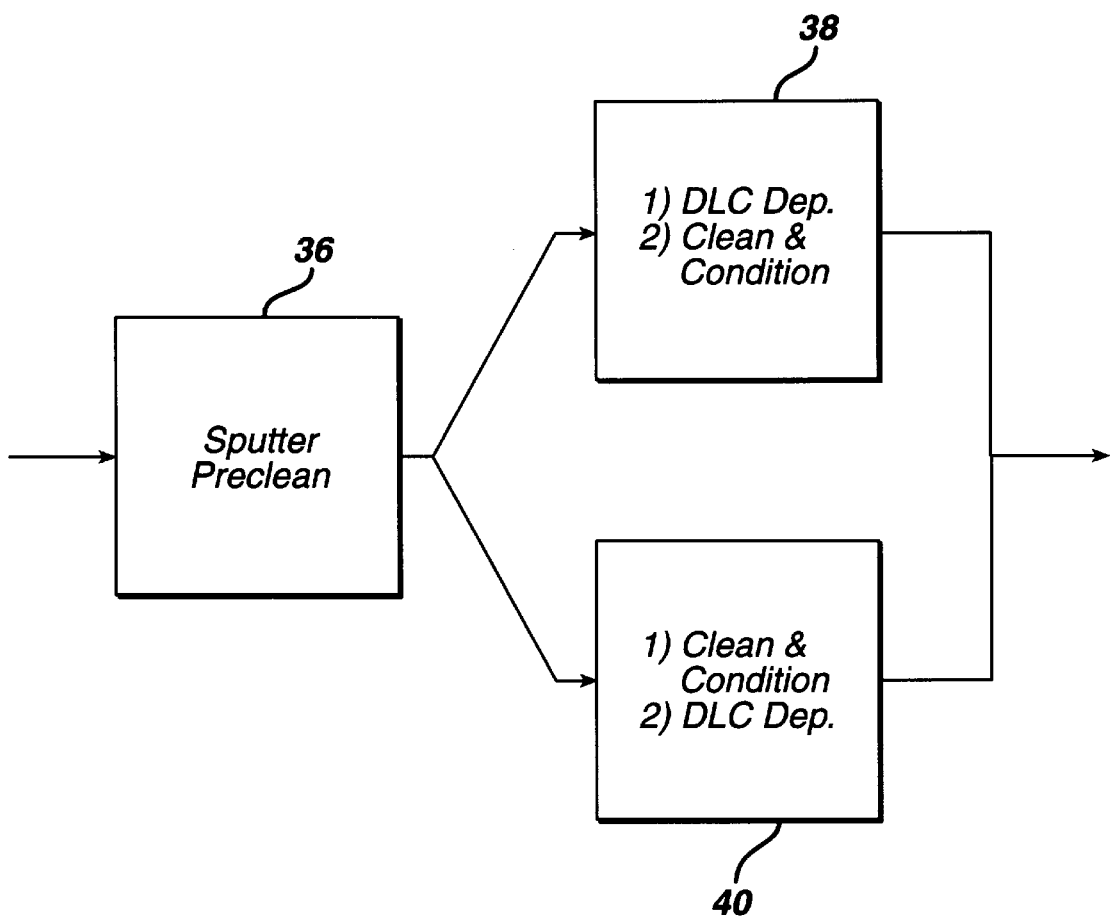
FIG. 17 is a flow diagram illustrating an example of a process flow for practice of the present invention.

FIG. 17 shows an exemplary manufacturing process flow for the present invention. The workpieces would typically benefit from a precleaning step 36 to enhance the adhesion of the DLC layer. This can be performed in a single RF induction chamber (at high rates) or in a conventional DC glow discharge chamber (at lower rates and longer process times). The preclean chamber can feed workpieces to two or more DLC deposition chambers 38 and 40 which use inductively coupled plasma sources. One of these chambers 38 can deposit on the blade stack while the other chamber 40 is being cleaned. Cleaning is desirable because the film builds up on the chamber walls and eventually can delaminate, resulting in particulate contamination. A further exemplary process flow is outlined in the table below:

| Time Step | Chamber A (36) | Chamber B (38) | Chamber C (40) |
|---|---|---|---|
| 1 | Preclean Stack | Clean Chamber | Idle |
| 2 | Load New Stack | Load Stack from A | Idle |
| 3 | Preclean Stack | Deposit DLC | Clean Chamber |
| 4 | Load New Stack | Unload | Load Stack from A |
| 5 | Preclean Stack | Clean Chamber | Deposit DLC |
| 6 | Load New Stack | Load Stack from A | Unload |
| 7 | Preclean Stack | Deposit DLC | Clean Chamber |
| 8 | Load New Stack | Unload | Load Stack from A |
| 9 | Go to Time Step 5 | Go to Time Step 5 | Go to Time Step 5 |

Exemplary process conditions for the process flows described above include the following:

| | | |
|---|---|---|
| 1) | Preclean Stack: | |
| | RF Induction Power: | 300 W |
| | RF Bias Voltage: | −300 V |
| | Time: | 30–60 sec. |
| | Gas: | Argon |
| | Pressure: | 5 × 10$^{-3}$ Torr |
| | Flow: | 50 standard cc/min. (sccm) |
| 2) | Deposit DLC: | |
| | Performed in accordance with the present invention. | |
| 3) | Clean Chamber: | |
| | RF Induction Power: | 1000 W |
| | RF Bias Voltage: | −200 V |
| | Time: | Approx. 2 × DLC deposition time |
| | Gas: | Oxygen |
| | Pressure: | 5 × 10$^{-3}$ Torr |
| | Flow: | 100 sccm |

As mentioned above, while the present invention is illustrated in the context of inductively coupled plasma enhanced chemical vapor deposition, other processes which are capable of generating high density plasma can also be used. These other processes include microwave plasma generation, electron cyclotron resonant plasma generation, and other RF high-density plasma generation processes, such as helicon wave source and helical resonator plasma generation.

The above description is not intended to limit the present invention. Alternative embodiments are possible. Accordingly, the scope of the invention should be determined by the appended claims and their legal equivalents, not by the embodiments described and shown above.

What is claimed is:

1. A method of creating a diamond-like carbon film on a substrate, comprising the steps of:

exposing the substrate to a hydrocarbon gas environment; and generating plasma in said environment of an electron density greater than approximately $5 \times 10^{10}$ per cm$^3$ and a sheath thickness less than about 2 mm under conditions of high ion flux and controlled, low energy ion bombardment said conditions including an ion current density greater than approximately 2 mA/cm$^2$ and a bias voltage within a range of approximately −100 volts to approximately −1000 volts.

2. The method of claim 1, wherein said environment comprises a gas selected from the group consisting of $C_4H_{10}$, $CH_4$, $C_2H_2$, $C_6H_6$, $C_2H_6$, and $C_3H_8$.

3. The method of claim 1, wherein said substrate is a metallic surface.

4. The method of claim 1, wherein said substrate is a metallic substance having a surface layer comprising a material selected from the group consisting of silicon, silicon carbide, vanadium, tantalum, nickel, niobium, molybdenum, and alloys thereof.

5. The method of claim 1, wherein said plasma is generated by inductive coupling.

6. The method of claim 5, wherein said inductive coupling comprises an ion current greater than approximately 3 mA/cm$^2$ and a bias voltage within a range of approximately −200 to approximately −500 volts.

7. The method of claim 6, wherein said sheath thickness is less than about 1.7 mm.

8. The method of claim 5, wherein said bias voltage is pulsed.

9. Plasma-enhanced chemical vapor deposition of a diamond-like carbon film onto a substrate, comprising the steps of:

exposing the substrate to a hydrocarbon environment; and generating a plasma in said environment with a plasma sheath thickness less than about 2 mm through inductive coupling comprising an ion current greater than approximately 2 mA/cm$^2$ and a bias voltage within a range of approximately −100 to approximately −1000 volts.

10. The method of claim 9, wherein said environment comprises a gas selected from the group consisting of $C_4H_{10}$, $CH_4$, $C_2H_2$, $C_6H_6$, $C_2H_6$, and $C_3H_8$.

11. The method of claim 9, wherein said substrate is a metallic surface.

12. The method of claim 9, wherein said substrate is a metallic substance having a surface layer comprising a material selected from the group consisting of silicon, silicon carbide, vanadium, tantalum, nickel, niobium, molybdenum, and alloys thereof.

13. The method of claim 9, wherein said inductive coupling comprises an ion current greater than approximately 3 mA/cm$^2$ and a bias voltage within a range of approximately −200 to approximately −500 volts.

14. The method of claim 13, wherein said plasma has a sheath thickness less than about 1.7 mm.

15. The method of claim 9, wherein said bias voltage is pulsed.

* * * * *

UNITED STATES PATENT AND TRADEMARK OFFICE
CERTIFICATE OF CORRECTION

PATENT NO.    : 6,077,572
DATED         : June 20, 2000
INVENTOR(S)   : Jeffrey A. Hopwood, et al.

It is certified that error appears in the above-identified patent and that said Letters Patent is hereby corrected as shown below:

Column 7,
Line 18, after chart insert -- All runs at 5 mTorr $C_4H_{10}$. --.

Signed and Sealed this

Thirteenth Day of November, 2001

Attest:

NICHOLAS P. GODICI
Attesting Officer        Acting Director of the United States Patent and Trademark Office